United States Patent [19]

Whight

[11] 4,242,596
[45] Dec. 30, 1980

[54] INTEGRATED INJECTION LOGIC CIRCUITS

[75] Inventor: Kenneth R. Whight, Crawley, England

[73] Assignee: U.S. Philips Corporation, New York, N.Y.

[21] Appl. No.: 922,964

[22] Filed: Jul. 10, 1978

[30] Foreign Application Priority Data

Jul. 14, 1977 [GB] United Kingdom ............... 29615/77

[51] Int. Cl.³ .......................................... H03K 19/091
[52] U.S. Cl. ................................... 307/211; 307/213; 357/92
[58] Field of Search ....................... 357/92, 44, 46, 36; 307/211, 213, 203, 207, 209

[56] References Cited

U.S. PATENT DOCUMENTS

| | | | |
|---|---|---|---|
| 3,644,923 | 2/1972 | Foerster | 307/211 |
| 3,815,106 | 6/1974 | Wiedmann | 357/92 |
| 3,838,393 | 9/1974 | Dao | 307/211 |
| 3,916,215 | 10/1975 | Gaskill, Jr. et al. | 307/211 |
| 4,027,175 | 5/1977 | Hurst | 307/211 |
| 4,056,810 | 11/1977 | Hart et al. | 357/92 |
| 4,081,822 | 3/1978 | Dao et al. | 357/92 |
| 4,137,469 | 1/1979 | Chapron | 357/92 |
| 4,140,920 | 2/1979 | Dao et al. | 357/92 |

OTHER PUBLICATIONS

Elmasary, Folded collector integrated injection logic, IEEE J. of Solid–State Circuits, vol. SC 11, No. 5, Oct. 1976, pp. 644–647.

Boonstra et al., IEEE J. of Solid–State Circuits, vol. SC 8, No. 5, Oct. 1973, pp. 306–307.

Primary Examiner—William D. Larkins
Attorney, Agent, or Firm—Thomas A. Briody; Robert T. Mayer; James J. Cannon, Jr.

[57] ABSTRACT

An integrated injection logic circuit having at least one threshold logic gate having a plurality of weighted logic inputs and a weighted fixed input determining the threshold, said gate having first and second transistors connected as a bistable with the collector zone of the first transistor connected to the base zone of the second transistor and the collector zone of the second transistor connected to the base zone of the first transistor, at least one of said first and second transistors having a further collector zone provided with a conductive output connection, a plurality of current injector structures being present for determining the bias currents supplied to the first and second transistors, the state of bistable being determined in accordance with the difference in magnitude of total bias current supplied to the first transistor and total bias current supplied to the second transistor, said plurality of current injector structures being associated with the logic inputs and at least one injector structure associated with a fixed input.

13 Claims, 18 Drawing Figures

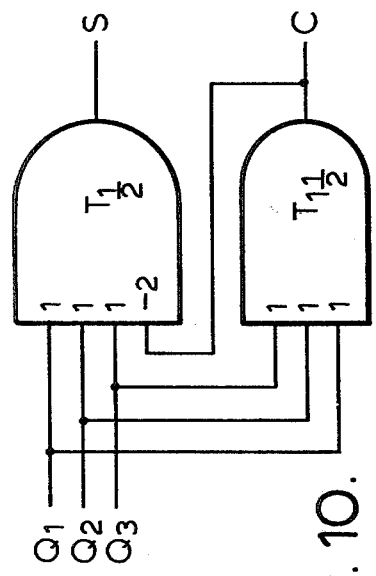
Fig. 10.
Fig. 12.
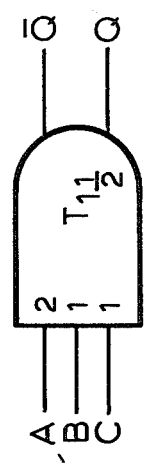
Fig. 9.
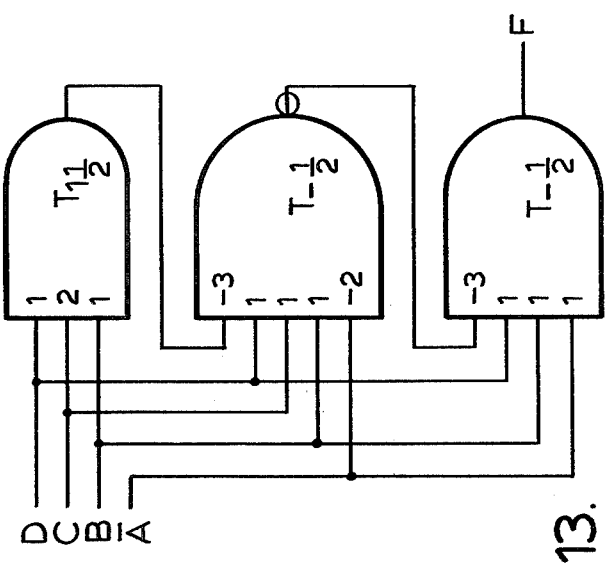
Fig. 13.

INTEGRATED INJECTION LOGIC CIRCUITS

BACKGROUND OF THE INVENTION

1. Field of the Invention

This invention relates to integrated injection logic circuits, referred to generally as I²L circuits.

Integrated injection logic circuits are described in U.S. Pat. Nos. 4,056,810 and 4,078,208 and for a further description of the mechanism by which such current injection integrated circuits operate and the advantages inherent in the structures, reference is invited to "Philips Technical Review," Volume 33, 1973, No. 3, pages 76 to 85.

2. Description of the Prior Art

Logic circuits employing threshold functions are generally known. Threshold functions generally encompass digital signals which include more levels than the two levels of conventional binary signals. In particular, threshold logic is a digital system in which the output from a gate is determined by an algebraic sum of the weighted inputs, that is, the output state (0 or 1) Q is determined by $$\sum_{m=1}^{n} W_m X_m$$

where $W_m$ is the numerical weight of the $m^{th}$ input (where for the purpose of calculation $W_m$ is considered to be restricted to positive or negative integer values), $X_m$ is the $m^{th}$ input variable (0 or 1), and, n is the total number of inputs.

The actual point at which Q changes from 0 to 1 is set by the gate threshold $W_t$, that is $$Q = 0 \text{ when } \sum_{m=1}^{n} W_m X_m < W_t$$

$$\text{and } Q = 1 \text{ when } \sum_{m=1}^{n} W_m X_m > W_t$$

If for the purpose of calculation $W_t$ is restricted to positive or negative integer plus one-half values no ambiguity arises in these equations.

Thus a single threshold logic gate can be used for deciding whether or not at least x out of y inputs are ON (x<y). Also by the use of the weighting of inputs it is possible to implement Boolean functions such as A+B·C with a single gate. This is to be compared with normal Boolean logic systems where a gate with a certain number of inputs can perform one only of two functions (and their complements), namely (a) the AND function where all inputs are ON, and (b) the OR function where at least one input is ON.

As an example of the use of a threshold logic gate there is quoted the case where there are three input variables A, B and C respectively having weights $W_A=2$, $W_B=1$, $W_C=1$ and the gate has a threshold weight $W_t=1\frac{1}{2}$. In this case In this case $\sum_{m=1}^{n} W_m X_m > W_t$, i.e. $Q = 1$, if $A = 1$ or $B = C = 1$ or $W_m X_m > W_t$, i.e. Q=1, if A=1 or B=C=1 or A=B=C=1. Such a gate therefore detects the state A+(B·C) where + and · respectively refer to the Boolean OR and AND connectives. If the threshold weight $W_t=2\frac{1}{2}$ then the state detected is A·(B+C). For a full description of threshold logic reference is invited to the book by S. L. Hurst entitled "Threshold Logic" (M&B Monograph EE/1 1971).

In U.S. Pat. No. 4,081,822 there are described integrated injection logic circuits having threshold functions. In these circuits multiple-collector input transistors are employed to switch states under control of binary input signals. The collectors of the input transistors are connected to the bases of one or more output transistors which have different threshold weights determined by different levels of injection current. The ON or OFF state of each output transistor is controlled by its threshold weight and by the state of one or more input transistors to which it is connected. The injection current is conducted into the output transistor base or into an input transistor collector depending upon whether the input transistor is OFF or ON. Single weighted output transistors are in the OFF state when at least a single connected input transistor is in the ON state. Double weighted output transistors are in the OFF state only when at least two connected input transistors are in the ON state and so on.

In these circuits the threshold function is built up from a plurality of interconnected transistors and implementation of certain functions requires long series connections of transistors resulting in some instances in long propogation delay times. Furthermore in this system the basic gate, namely the basic I²L transistor gate, is not a full threshold gate, the threshold gate having to be built up from a series of the basic I²L transistor gates. Also in this system it is not readily possible to implement logic inputs with negative weightings.

SUMMARY OF THE INVENTION

According to the invention there is provided an integrated injection logic circuit comprising at least one threshold logic gate having a plurality of weighted logic inputs and a weighted fixed input determining the threshold, said gate comprising first and second transistors connected as a bistable with the collector zone of the first transistor connected to the base zone of the second transistor and the collector zone of the second transistor connected to the base zone of the fist transistors, at least one of said first and second transistors having a further collector zone provided with a conductive, output connection, a plurality of current injector structures being present for determining the bias currents supplied to the first and second transistors, the state of the bistable being determined in accordance with the difference in magnitude of total bias current supplied to the first transistor and total bias current supplied to the second transistor, said plurality of current injector structures comprising injector structures associated with the logic inputs and at least one injector structure associated with a fixed input.

In this circuit the basis of a threshold logic gate is a transistor bistable pair and this provides significant advantages not only in terms of the simplicity of the layout of the circuit including relatively simple interconnection patterns but also in terms of the considerable complexity of the logic functions that may be reproduced in a single gate. In particular the use of the injection current controlled transistor bistable as the basic element enables the reproduction in a simple form of logic functions which involve the use of both positive and negative weighted thresholds. Furthermore the complement to a function may be readily available. Another advantage is that the date inputs to the logic gate are presented in parallel and thereby avoiding long series connections of transistors and consequent long propogation delay time.

The operation of the threshold logic gate comprising the transistor bistable pair is based on the first transistor being ON or OFF and the second transistor being OFF or ON respectively depending upon the level of the total bias current supplied to the base of the first transistor being greater or less respectively than the total bias current supplied to the base of the second transistor. The fixed input representing the threshold weighting of the gate is represented by a level of bias current of a magnitude according to the weighting and variable inputs consisting of logic input signals are represented by levels of bias current of a magnitude according to the weighting of said inputs, a fixed input bias current when supplied to the base of the first transistor being considered in a positive sense and when supplied to the base of the second transistor being considered in a negative sense, and a logic input bias current when supplied to the base of the second transistor being considered in a positive sense and when supplied to the base of the first transistor being considered in a negative sense.

In one form of the circuit means are provided for the periodic discharging of the transistor bistable pair so that following the discharging the state of the bistable will be determined by the difference in magnitude between the levels of the bias currents supplied to the first and second transistor bases.

In other forms of the circuit in accordance with the invention the change of state in the circuit occurs continuously and there is no necessity of periodically discharge the bistable. In such a form in each of the first and second transistors in the bistable there is an additional collector zone which is internally connected to the base zone for producing a normalised collector current in each of the collectors of the transistor. This form of connection in linear circuits is referred to as a current mirror. By the provision of such collector current normalization connections in the first and second transistors of the bistable the state of the bistable will be determined by the difference in magnitude of the bias currents supplied to the transistor base zones and changes in state will occur continuously, thus not requiring the bistable to be periodically discharged as in the first described form of the circuit in accordance with the invention.

In currently preferred forms of the circuit the first and second transistors are provided as so-called inverted vertical transistors, that is with the collector zones of smaller area than the emitter zones and with the collector/base junction and emitter/base junction situated mainly parallel to the main surface of the semiconductor body. In such a circuit in which the first and second transistors have said normalized collector current connection said first and second transistors are provided in a semiconductor layer of the one conductivity type which constitutes the emitter zones, the base zones being formed by surface regions of the opposite conductivity type situated within the layer of the one conductivity type, the collector zones being formed in the respective regions of the opposite conductivity type by surface regions of the one conductivity type, and in each of first and second transistors the surface area of the additional collector zone which is connected to the base zone being less than the surface area of the or each remaining collector zone. In this manner the gain of the current mirror $\beta_m$, that is the gain as measured through a free collector of unit area, which in practice corresponds to the collector connected to the base of the other transistor in the bistable pair, can be made to equal unity, it being noted that in the case of using collector zones of equal area the gain $\beta_m$ will be less than 1 because the gain $\beta_m$ is given by the formula $$\beta_m = \frac{1}{(1 + \frac{1}{\beta})}$$

where $\beta$ is the gain measured through a single free collector of unit area when the current normalizing connection is not present, due to $\beta$ not approaching infinity but having a value commonly between 1 and 15 for the particular kind of devices concerned.

In said circuit having in each of the first and second transistors such a collector zone internally connected to the base and of smaller surface area than the or each remaining collector zone, in one or both of said first and second transistors a collector zone having an output conductive connection may be of greater surface area than that collector zone in the same transistor which is connected to the base zone of the other transistor. As gain depends on collector area the larger the output collector the greater the fan-out capability of the gate.

In a form of the integrated injection logic circuit in accordance with the invention in which the logic inputs each have a positive weighting and the fixed input has a positive weighting, the current injector structures associated with the logic inputs are arranged for supplying bias current to the second transistor of the bistable and the or each current injector structure associated with the fixed input are arranged to provide the supply of a net fixed bias current to the first transistor of the bistable.

In more complex forms of the circuit the logic inputs comprise at least one input having positive weighting and at least one input having a negative weighting, the or each current injector structure associated with a positive weighted logic input being arranged for supplying bias current to the first transistor of the bistable and the or each current injector structure associated with a negative weighted logic input being arranged for supplying bias current to the second transistor of the bistable.

In the last mentioned forms, according as the fixed input is of positive or negative weighting, the or each current injector structure associated with the fixed input is arranged to provide the supply of a net fixed bias current to the first transistor or to the second transistor respectively.

If there is a requirement to use a variable in its complement form, a form of negative weighting is used. Thus the complement $\overline{A}$ of a required logic input A with a weighting $W_A$ of certain sign is used by the provision of a current injector arranged to provide a weighted bias current of the appropriate magnitude $W_A$ but of the opposite sign and the or each current injector structure associated with the fixed input is arranged to provide the supply of net fixed bias current which is of an amount corresponding to the required threshold fixed bias current of the gate less an amount equal to the weighting $W_A$ of the bias current corresponding to said logic input A.

Various means of providing the current injector structures with respect to the first and second transistor base zones to be biased are possible. Thus, for example, it is possible to use so-called vertical injector structures as are described in U.S. Pat. No. 4,056,810. However in currently preferred forms the current injector structures are of a so-called lateral form, the transistor base zones to be biased and the current injector structures are arranged such that the base zone characteristic of one conductivity type of a transistor in the bistable receives bias current of carriers characteristic of said one conductivity type which are injected from a semiconductor zone of the one conductivity type of the current injector into a zone of the opposite conductivity type separating said base zone from said current injector zone of the one conductivity type, the weighting of an input being determined by the length of the current injector zone of said one conductivity type over which said injection of carriers occurs.

The lateral current injector structures are readily adaptable for providing bias current of various different weightings because the injection of charge carriers from the said current injector zone of the one conductivity type is substantially uniform per unit length of said zone and therefore corresponding injector zones of different length are used to achieve the magnitude weighting. It is of course possible to use other means to obtain different levels of injected bias current for determining the magnitude weighting and in this respect reference is invited to U.S. Pat. No. 4,056,810.

In some forms of the circuit employing the said lateral current injectors, the current injector structures are each formed of three succeeding semiconductor regions of alternating conductivity type, of which the third regions correspond to the base zones of the first and second transistors of the bistable.

In other forms of the circuit employing the said lateral current injectors, the current injector structures are each formed of five succeeding semiconductor regions of alternating conductivity type, of which the fifth regions correspond to the base zones of the first and second transistors of the bistable.

In the last-mentioned forms, so-called five-layer injectors are employed. In a currently preferred form, in each of the current injector structures associated with the logic inputs there is a conductive input connection to the third region and in the or each current injector structure associated with the fixed input there is no conductive connection to the third region, means being present for connecting the first regions of all the current injector structures in common and for connecting all the second regions of the current injector structures in common. In this manner there is provided full compatibility with conventional integrated injection logic circuitry as will be described hereinafter. Furthermore when using such five-layer current injector structures there is additionally provided the facility to reproduce more complex logic functions employing so-called interacting inhibition by providing in a third region of at least one current injector structure associated with the logic inputs the collector zone of a vertical transistor structure of which the emitter zone is formed by the region which constitutes the second layer of the current injector, a connection being present between said collector zone and the third region of another current injector structure associated with a logic input. This connection may be to an injector structure associated with a positive weighted logic input or a negative weighted logic input.

BRIEF DESCRIPTION OF THE DRAWINGS

Embodiments of the invention will now be described, by way of example, with reference to the accompanying diagrammatic drawings, in which:

FIG. 9 shows in block schematic form the logic gate shown in FIG. 8;

FIG. 10 shows in block form the logic diagram of a full adder circuit when implemented in threshold logic;

FIG. 12 shows the truth table of a complex logic function;

FIG. 13 shows in block form a logic diagram of the logic function as represented by the truth table of FIG. 12 and when implemented in threshold logic in a form having three gates;

DESCRIPTION OF THE PREFERRED EMBODIMENTS

Figure 1:
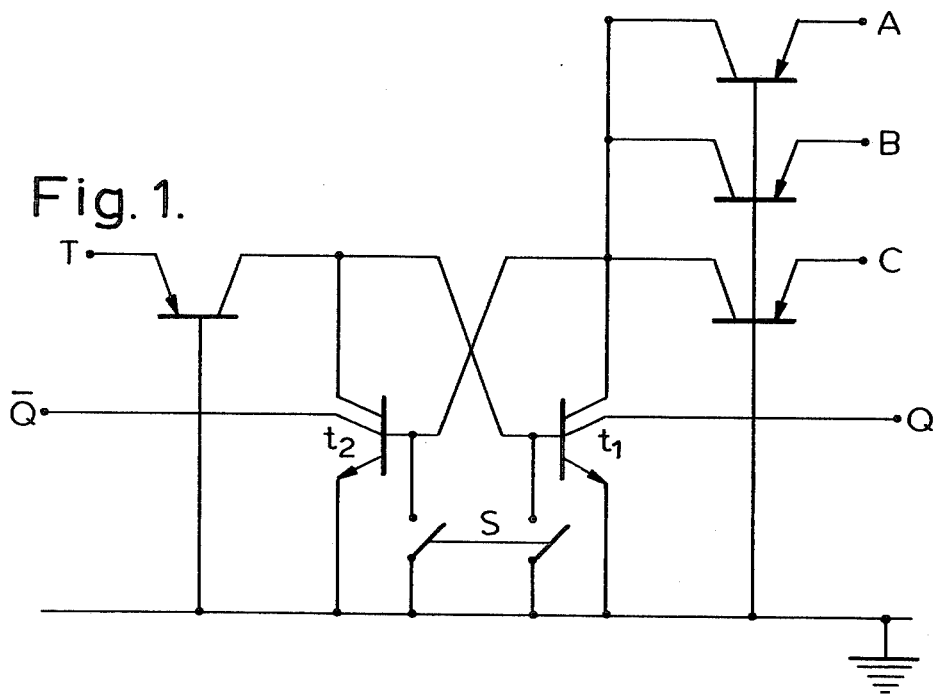
FIG. 1 is a circuit diagram of part of a first embodiment of an I$^2$L circuit in accordance with the invention.

Referring now to FIG. 1 there is shown a logic gate forming part of an I$^2$L circuit in accordance with the invention and having three variable logic inputs and one fixed input. The gate comprises a bistable having two n-p-n transistors $t_1$ and $t_2$ of which the base zone of $t_1$ is connected to a first collector zone of $t_2$ and a first collector zone of $t_1$ is connected to the base zone of $t_1$, the emitter zones being connected in common. The transistor $t_1$ has a second collector zone which has an output conductive connection and represented as an output Q. The transistor $t_2$ has a second collector zone which has an output conductive connection which is represented as the complement $\overline{Q}$. Three p-n-p transistors of which variable logic inputs A, B and C are applied to the emitter zones are connected with their base zones and collector zones in common, these transistors constituting three-layer current injector structures for supply of bias current to the base of transistor $t_2$. A further p-n-p transistor having a fixed input T constitutes a three-layer current injector structure for supply of bias current to the base of transistor $t_1$. The injector structure associated with the fixed input T provides a constant supply of bias current $I_T$ to the base of $t_1$ and of a predetermined magnitude in accordance with the desired weighting $T_{WT}$ of the logic gate. The injector sructures associated with the variable inputs A, B and C can provide, depending upon whether the inputs are energized or not, bias currents each of a predetermined magnitude $I_A$, $I_B$ and $I_C$ in accordance with the desired weightings $W_A$, $W_B$ and $W_C$ of the logic inputs of the gate. The predetermined magnitude of bias current provided by a three-layer current injector is a function of the voltage applied to and the length of the first region of the current injector as will be described in greater detail hereinafter.

Operation of the circuit shown in FIG. 1 is as follows. A switch S is shown to represent a clocking means for periodically discharging the bistable. On opening the switch the final state of the bistable will be determined by input currents supplied by the current injectors. When $I_T > I_A + I_B + I_C$ then $t_1$ will be ON and $t_2$ OFF. When $I_T < I_A + I_B + I_C$ then $t_1$ will be OFF and $t_2$ ON. Thus the bias current $I_T$ from the injector associated with the fixed input T can be considered to be a threshold current which must be exceeded by the sum of the bias currents supplied by the injectors associated with the logic inputs A, B and C in order for the bistable to attain the state $t_2$ ON and $t_1$ OFF. The particular switching function of the input variables A, B and C realised by the logic gate of FIG. 1 will be determined by the input weightings $W_A$, $W_B$, $W_C$ and the threshold weighting $W_T$. Thus in the case of $W_A = 2$, $W_B = W_C = 1$ and the threshold weighting $W_T = 1\frac{1}{2}$ the function realised is A+(B·C) where + and · respectively represent the Boolean connectives OR and AND. If the same values for $W_A$, $W_B$ and $W_C$ apply and the threshold weighting $W_T = 2\frac{1}{2}$ the function realises is A·(B+C).

In this manner there is provided the facility of detecting in a single gate functions that need a number of gates in a Boolean system together with the possibility of improving both time delay and packing density.

Figure 2:
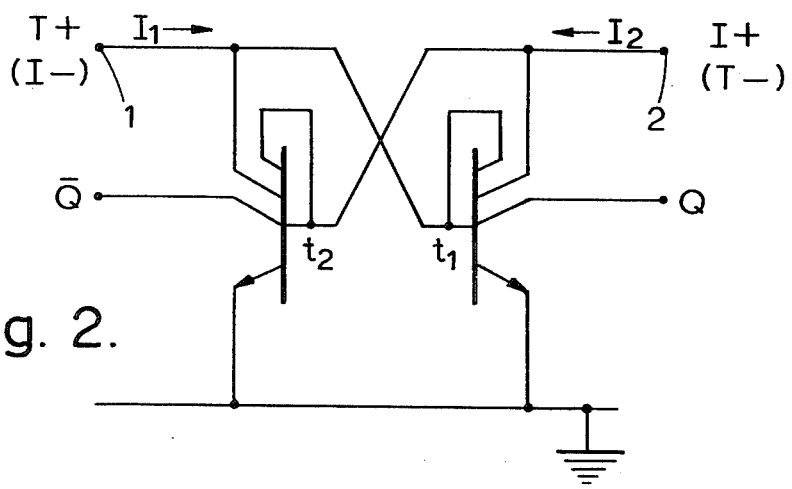
FIG. 2 is a circuit diagram of part of a second embodiment of an I$^2$L circuit in accordance with the invention and employing so-called 'current mirror' techniques.

In the circuit diagram of FIG. 2 there is shown a bistable transistor pair $t_1$, $t_2$ similar to that shown in FIG. 1 but in which in each of the two transistors $t_1$ and $t_2$ there is an additional collector zone which is internally connected to the base zone for producing a normalized collector current in each of the collectors of the transistor. This circuit configuration in a multi-collector transistor when used in analog circuits is referred to as a current mirror. The means whereby the current gain $\beta_m$, as previously referred to, is made equal to unity will be described hereinafter. The operation of the circuit as shown in FIG. 2, which does not require the periodic discharge of the bistable, is such that the state depends on the relative size of the total bias currents $I_1$ and $I_2$ supplied via current injectors connected at points 1 and 2. If $I_2 > I_1$ then $I_2$ can sink $I_1$ through transistor $t_2$ and thus $t_2$ is ON and $t_1$ OFF. If $I_2$ is decreased so that $I_2$ become less than $I_1$, $I_2$ can no longer sink $I_1$ through $t_2$ as $\beta_m = 1$, but $I_1$ is capable of sinking $I_2$ through $t_1$. Therefore the bistable switches state to $t_1$ ON $t_2$ OFF. The inputs of bias current to the bistable via points 1 and 2 are provided by current injector structures, of which some are individually associated with the variable logic inputs to the gate and the or each remaining current injector structure is associated with a fixed input in order to determine the threshold weighting. A positive weighted threshold input is indicated by T+ and the current injector associated with a fixed input to provide the bias current representative of said weighting is connected via point 1. A positive weighted logic input is indicated by I+ and a current injector associated with a variable input to provide the bias current representative of said weighting is connected via point 2. Similarly negative weighted threshold inputs indicated by T— are applied via point 2 and negative weighted logic inputs indicated by I— are applied via point 1.

Figure 3:
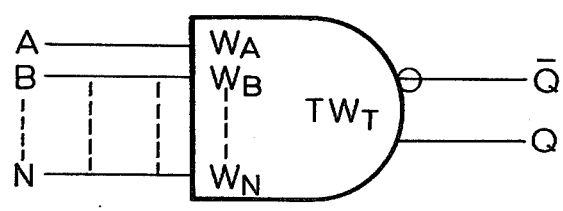
FIG. 3 shows in block schematic form a logic gate as present in an I$^2$L circuit in accordance with the invention.

FIG. 3 shows in block form a representation of a logic gate of the form shown in FIG. 2 and having a threshold weighting $W_T$ with logic inputs A, B . . . N respectively having weightings $W_A$, $W_B$ . . . $W_N$. This notation will be used in the description of some further embodiments.

Figure 4:
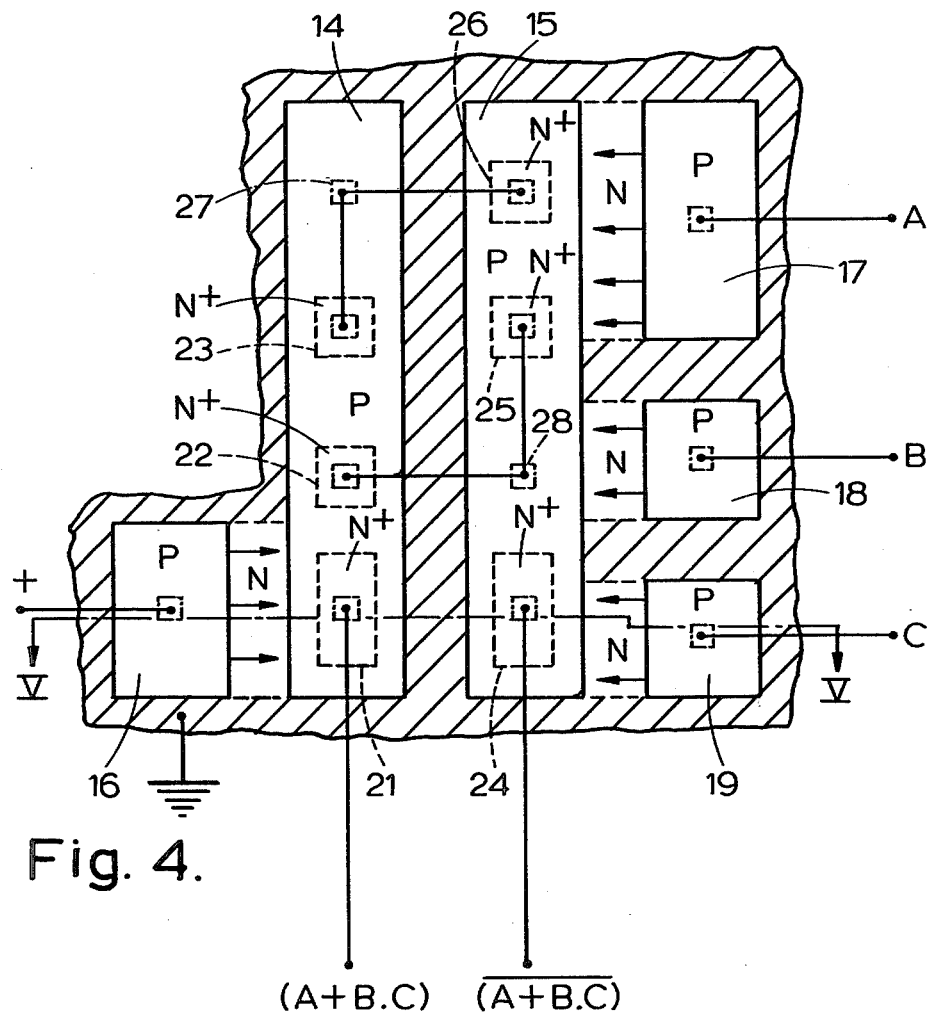
FIG. 4 shows in schematic plan view part of the semiconductor body of an I$^2$L circuit in accordance with the invention employing three-layer current injectors.
Figure 5:
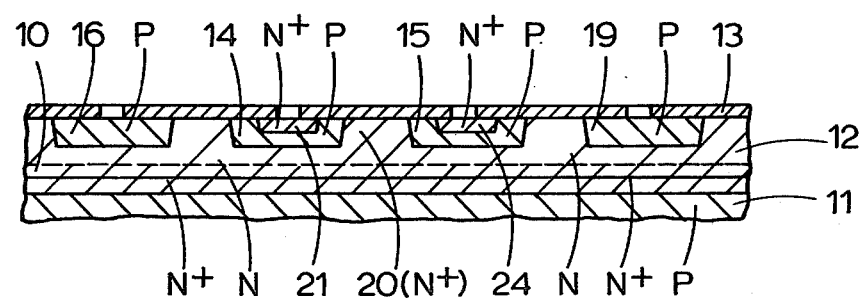
FIG. 5 is a schematic cross-sectional view taken along the line V—V in FIG. 4.

The schematic embodiments of an I²L circuit in accordance with the invention now to be described with reference to FIGS. 4 and 5 is a simple logic gate of the form as represented in FIG. 2 and in which the current injectors each have a three-layer structure. For the sake of simplicity of explanation the further circuit connection from the outputs and to the inputs are not shown, it being mentioned that in practice the particular configuration will be more complex. The semiconductor body of the integrated circuit comprises a p-type silicon substrate 11 having an n-type silicon epitaxial layer 12 thereon. In the part of the body shown in the section of FIG. 15 there is an n+-buried layer 10 in the vicinity of the interface beteen the substrate 11 and layer 12. At the surface of the layer 12 there is a silicon oxide layer 13. For the sake of clarity of oxide layer 13 is shown having a uniform thickness whereas in practice the thickness will vary over different parts of the surface. In the epitaxial layer 12 there are p-type diffused islands 14 to 19 which extend to the upper surface of the body. The p-type islands are partly bound by an n+-diffused region 20 which extends into the n-type layer 12 down to the buried n+-layer 10. For the sake of clarity the n+-surface region is shown with hatching in FIG. 4. It is noted that where the lateral edge of the p-type region faces the lateral edge of the p-type region 14 the n+-layer 20 is absent. Similarly the lateral facing edges of p-type regions 17 and 15, p-type regions 18 and 15, and p-type regions 19 and 15 are separated only by the n-type material of the epitaxial layer with the n+-layer 20 being absent in these areas.

In the p-type region 14 there are n+-surface regions 21, 22 and 23 and in the p-type region 15 there are n+-surface regions 24, 25 and 26. Ohmic connections 27 and 28 to the p-type regions 14 and 15 respectively are present via windows in the oxide layer 13. Interconnections are present on the surface and shown in solid lines for clarity whereas in practice they are formed by conductive tracks, for example of aluminium. Thus the n+-regions 23 and 26 are interconnected and via the ohmic connection 27 to the p-type region 14. Similarly the n+-regions 22 and 25 are interconnected and via the ohmic connection 28 to the p-type region 15. The p-type region 16 has a conductive connection which in operation is connected to the positive terminal of the supply, the negative side being connected to the n-type epitaxial layer 12. The p-type regions 17, 18, 19 have conductive connections and these are to the logic inputs A, B and C. The n+-regions 21 and 24 have output conductive connections and in practice these will be taken to further regions in the circuit.

The circuit shown in FIGS. 4 and 5 is a simple realization, for the purposes of illustration only, of a circuit of the form shown in FIG. 2 having three positive weighted inputs A, B and C and a single positive weighed threshold input. Transistors $t_1$ and $t_2$ have base zones respectively formed by the p-type islands 14 and 15, the emitter zones being formed by the n-type layer 12. In the transistor $t_1$ the n+-regions 21, 22 and 23 form collector zones of which the collector zone 23 is internally connected to the base zone via the connection 27. Similarly in the transistor $t_2$, the n+-regions 24, 25 and 26 form collector zones of which the collector zone 25 is internally connected to the base zone via the connection 28. In the transistor $t_1$ the output collector zone 21 is provided having larger areas than the collector zones 22 and 23 in order to increase the current gain and hence fan-out of the gate. Similarly in the transistor $t_2$ the output collector zone 24 is provided having a correspondingly larger area than the collector zones 25 and 26. The p-type regions 17, 18 and 19 each form the first layer of three-layer current injector structures of which the second layer is formed by the n-type layer 12 and the third layer by the p-type base zone 15. Thus the regions 17, 12, 15 form a lateral p-n-p transistor of which the emitter zone is the region 17 and the collector zone corresponds with the base zone 15 of transistor $t_2$. Similarly the regions 18, 12, 15 and 19, 12, 15 form lateral p-n-p transistors of which the collector zone corresponds to the base zone of the inverse vertical transistor $t_2$. The lengths of the p-type injector regions 17, 18, 19 facing the p-type base zone 15 of the $t_2$ are in the ratio 2:1:1. With a common voltage of the points A, B and C, when in the energized state, the injection current of holes into the n-type region 12 is proportional to the lengths of the regions 17, 18 and 19 facing the region 15 and these injection currents therefore represent weightings $W_A$, $W_B$ and $W_C$ of the logic input A, B and C of 2, 1 and 1 units respectively. In a similar manner the p-type region 16 constitutes the first layer of a lateral p-n-p three-layer current injector structure 16, 12, 21 and the length of the p-type region 16 facing the region 14 forming the base zone of $t_1$ is of 1½ units in relation to the lengths of the injecting edges of the regions 17, 18 and 19. Thus with the region 16 at a fixed voltage corresponding to said common voltage the fixed input of bias current to $t_1$ has a weighting of 1½ units. Therefore as previously described this logic gate detects the function (A+B·C) at the output connection to collector zone 21 and its complement at the output connection to collector zone 24.

Figure 6:
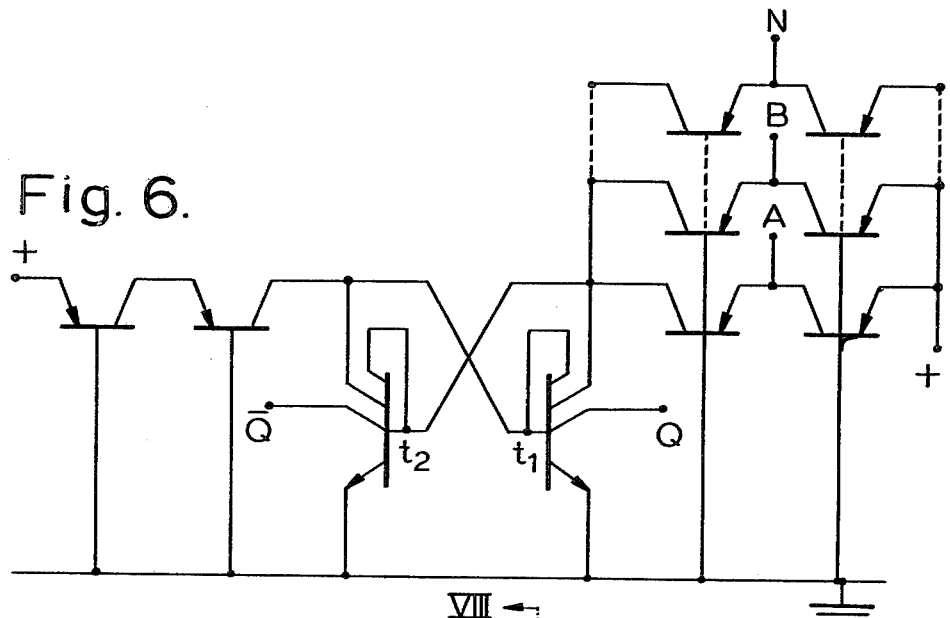
FIG. 6 shows the circuit diagram of part of an I$^2$L circuit in accordance with the invention and employing five-layer current injectors.

Referring now to FIG. 6 there will now be described a further embodiment of an I²L circuit in accordance with the invention in which five-layer current injectors are used and which is fully compatible with existing I²L techniques. The bistable corresponds to that as described with reference to FIG. 2. The main difference resides in the use of five-layer current injectors on each side of the bistable instead of three-layer current injectors. These are each formed by series connected pairs of lateral p-n-p transistors in which the collector of the first transistor corresponds to the emitter of the second transistor. The p-type emitters of the first lateral transistors of each pair are connected to the positive supply terminal in operation and constitute injectors of primary bias current, the base zones of said transistors forming the current injector second layers being commonly connected to the other supply terminal or ground. The p-type emitter zones of the second transistors of the pair constitute sources of reinjected bias current derived from said primary bias currents. For a detailed description of the mechanism of the five-layer injector reference is invited to U.S. Pat. No. 4,056,810.

The logic gate shown in FIG. 6 has N positively weighted logic input A, B . . . N and a single positively weighted threshold input. The logic input signals are applied as shown to the third layer of the current injector structures which provide bias current to the base of $t_2$. In this manner the logic input signal supplied to a current injector structure serves to either divert the primary bias current in that injector structure or to enable the generation of reinjected bias current for supply to the base of $t_2$. For the supply of the threshold current the supply is of fixed reinjected bias current, there being no connection to the third layer of the current injector as the primary bias current in this injector must always be fed to the base of transistor $t_1$. Thus all the bias currents entering the bistable are a factor of $\alpha^2$ down on the current drawn from the power supply where $\alpha$ is the common base current gain of each lateral p-n-p transistor structure.

Figure 7:
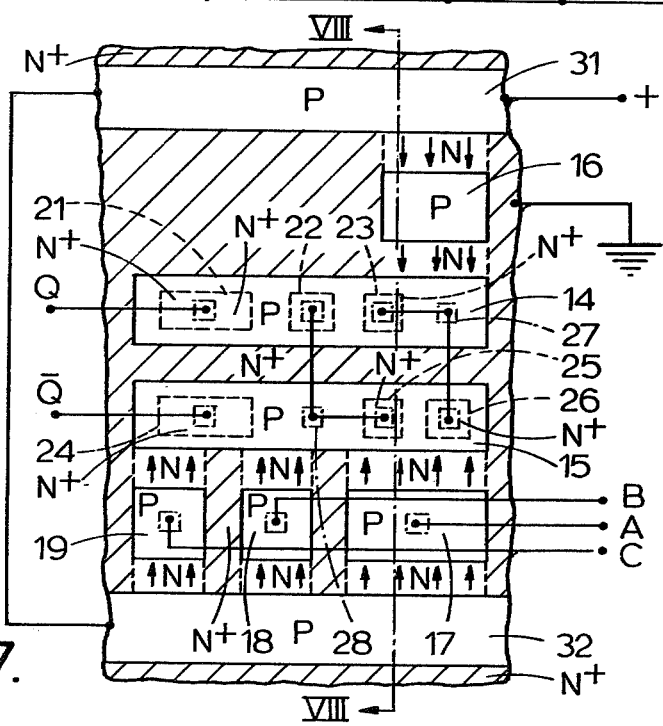
FIG. 7 shows in schematic plan view part of the semiconductor body of an I$^2$L circuit of the form shown in FIG. 6.
Figure 8:
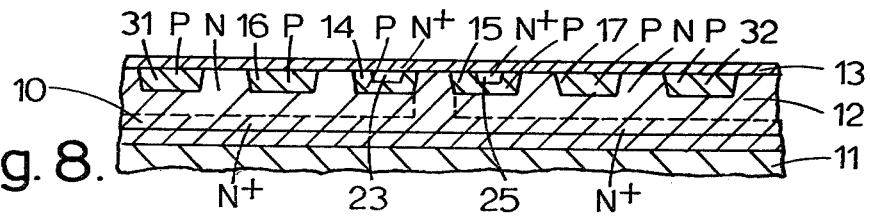
FIG. 8 is a schematic cross-sectional view taken along the line VIII—VIII of FIG. 7.

In the plan view of FIG. 7 and section of FIG. 8 an example of a circuit of the form shown in FIG. 6 is shown. This is a single logic gate having logic inputs A, B and C having weightings respectively of 2, 1 and 1 units and having a threshold weighting of 1½ units. This gate is diagrammatically represented in the block diagram of FIG. 9 and the logic function reproduced is the same as in FIGS. 4 and 5, namely A+(B·C). In the plan view of FIG. 7 and section of FIG. 8 the various layers and regions of the semiconductor which correspond with those present in the embodiment of FIGS. 4 and 5 are indicated with the same reference numerals. The main difference resides in that the p-type injectors regions 16 and 17 to 19 supply reinjected bias current which is derived from primary bias current provided by further p-type injector regions 31 and 32. Thus p-type primary injector region 31 which is connected to the positive side of the power supply injects holes across a portion of the n-type region 12 into the facing edge of the p-type region 16. This provides a fixed reinjected bias current input to the base 14 of $t_1$. Similarly the p-type primary injector region 32 which is also connected to the positive side of the power injects holes across portions of the n-type region 12 into the facing edges of the p-type regions 17, 18 and 19. The logic input signals are applied via conductive connections to said regions 17, 18 and 19. In this manner reinjected bias currents of magnitudes determined by the length of the edges of the regions 17, 18 and 19 can be fed to the base zone 15 of $t_2$ in accordance with whether the inputs A, B and C are high or low. In this structure the lengths of the regions 16 and 17 to 19 facing the respective transistor base zones 14 and 15 are in the ratio 1½:2:1:1 units.

For building the gate shown into a more complex circuit it is to be noted that the input A has a fan-in of 2 units, while inputs B and C each have a fan-in of 1 unit. The fan-out of such a logic gate is determined by three factors. These are (a) the areas of the output collectors 21 and 24, (b) the minimum base current supplied when an output 0 is required. This minimum base current can be increased if necessary by adding extra current injectors equally to both sides of the bistable, (c) the $h_{FB}$ ($\alpha$) of the lateral p-n-p transistor supplying reinjected bias current to the bistable. For example in the circuit of FIGS. 7 and 8, the output Q has a fan-out of $4.5\alpha$, that is a base current of $1\frac{1}{2}$ units and a triple size collector.

FIG. 10 shows in block schematic form a full adder circuit as represented in threshold logic. This comprises two threshold logic gates, one having a positive weighting of $\frac{1}{2}$ unit and yielding the sum S and the other having a positive weighting of $1\frac{1}{2}$ units and yielding the carry C. Each gate has inputs $Q_1$, $Q_2$ and $Q_3$ derived as outputs from other gates in the integrated circuit in which the full adder is present, each input having a positive weighting of 1 unit. A feedback from the carry to the sum has a negatively weighted input of 2 units.

Figure 11:
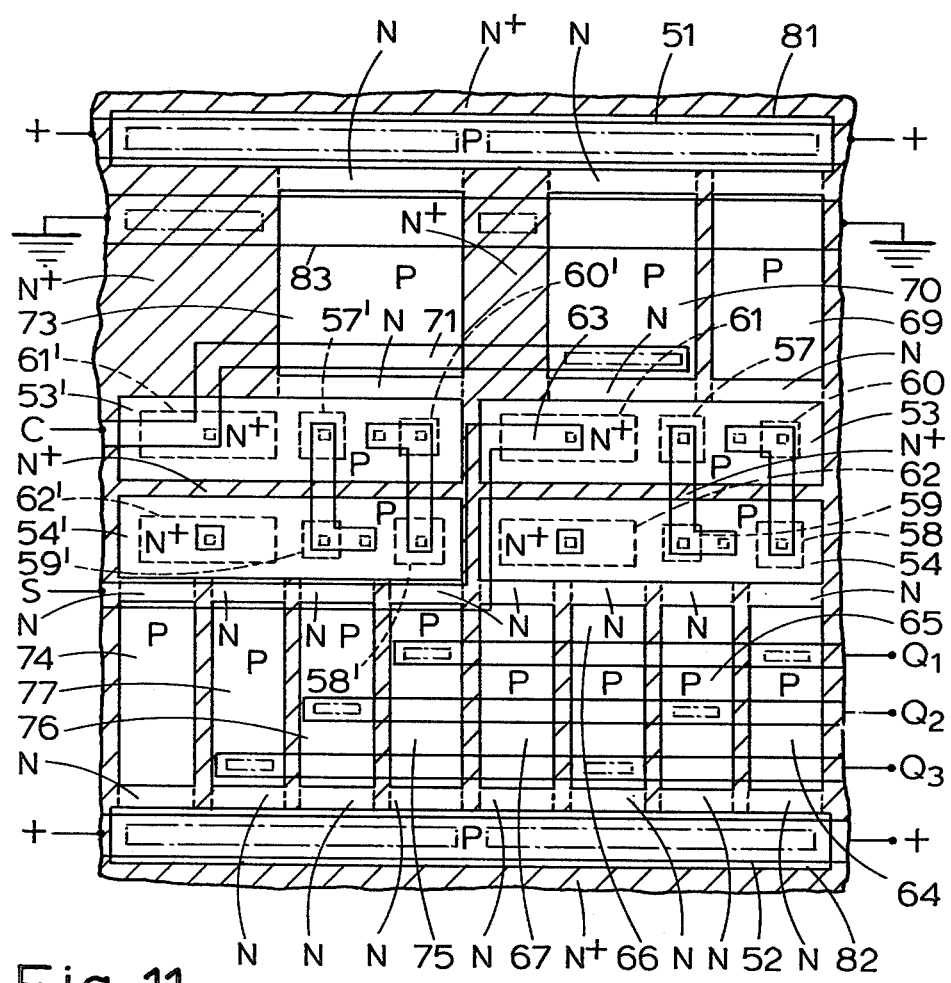
FIG. 11 is a plan view of the semiconductor body of an I$^2$L circuit in accordance with the invention in which the full adder circuit of FIG. 10 is present.

FIG. 11 shows the lay-out in a practical circuit in which the full adder of FIG. 10 is present, this circuit being realized using five-layer injector structures in a manner corresponding to that shown in FIGS. 7 and 8. The semiconductor body is of a corresponding form comprising a p-type substrate having an n-type epitaxial layer thereon in which the circuit elements are formed. Two p-type islands 51 and 52 form primary injector strips, each constituting the first layer of five-layer current injector structures. In the center of the Figure p-type regions 53 and 54 forming the base regions of a bistable pair of one logic gate. Similarly the p-type regions 53' and 54' form the base regions of a bistable pair of a second logic gate. Those parts of the surface to which an n+-isolating surface region extend are shown as in previous Figures, hatched. In this way it is shown which parts of the various p-type island surface regions are bounded by the n+-surface layer. The bistable pairs of the first and second logic gates are of a configuration similar to that described with reference to FIG. 7. Thus in the first logic gate the transistors with base regions 53 and 54 are cross coupled via a connection between a collector zone 57 and the base zone 54 and a connection between a collector zone 58 and the base zone 53. These interconnections are combined in the same conductive tracks with the normalised collector current connections between an additional collector zone 60 and the base zone 53 and between an additional collector zone 59 and the base zone 54. Output collector zones 61 and 62 are present but in the present circuit there is no external connection to the zone 62, the connection to the zone 61 being by way of a conductive track 63 forming the sum S output.

The input currents to the bistable pair of the first logic gate are supplied by five-layer injector structures situated on the opposite sides of the bistable. On the lower side shown there are four injector structures all having the p-type region 52 as the first layer of the primary injector. The second and fourth layers of each of these injector structures are formed by portions of the n-type epitaxial layer. The third layers are formed by p-type regions 64 to 67. The fifth layer of each injector structure is formed by the p-type base zone 54 of one of the vertical inverse n-p-n transistors of the bistable.

At the lower part of the Figure there are present three parallel extending conductive tracks connected to logic inputs $Q_1$, $Q_2$ and $Q_3$. The p-type region 64 is contacted, via an opening in the surface insulating layer in the semiconductor body by the track connected to the input $Q_1$. Similarly the p-type region 65 is contacted by the track connected to the input $Q_2$ and the p-type region 66 is contacted by the track connected to the input $Q_3$. The p-type region 67 is not contacted by a conductor track.

The current injector structures at the lower side of the bistable having p-type region 64, 65 and 66 as their third layers can supply reinjected bias current to the base zone 54 in accordance with the level of the inputs $Q_1$, $Q_2$ and $Q_3$. Such bias current has a weighting determined by the lengths of the regions 64 to 66 facing the region 54 which is 1 unit in the present case for each of said structures. The five-layer injector structure having the p-type region 67 as the third layer constitutes a fixed input of reinjected bias current having a weighting of 1 unit.

At the upper side of the bistable of the first logic gate there are now five-layer current injector structures both having the p-type region 51 as the first layer of the primary injector. The second and fourth layers of each of these current injector structures are formed by portions of the n-type epitaxial layer. The third layers are formed by p-type regions 69 and 70. The fifth layer of each injector structure is formed by the p-type base zone 53 of one of the vertical inverse n-p-n transistors of the bistable.

The p-type region 69 is not contacted and the five-layer current injector structure including this region constitutes a fixed input of reinjected bias current, the weighting of which is $1\frac{1}{2}$ units because the length of the region 69 facing the region 53 is 1.5 times the lengths of the regions 64 to 67 facing the region 54, it being noted that the levels of injected bias current per unit length are the same on both sides of the bistable as the injectors 51 and 52 are connected to the same positive supply terminal, the separation of the first and third layers as well as the separation of the third and fifth layers being maintained constant on both sides of the bistable as well as the widths of the third layers. The p-type region 70 is contacted by a conductive track 71 which is connected to the output collector of one of the transistors in the second bistable. The five-layer injector structure including the region 70 as the third layer can supply reinjected bias current to the base zone 53 in accordance with the input level on conductor 71 which in turn is provided by the output of the second logic gate. The bias current has a weighting of 2 units determined in accordance with the length of the part of the region 70 facing the region 53. Thus in the first logic gate there are on the upper side a fixed input of injected bias current of $1\frac{1}{2}$ units weighting, and a variable input of 2 units weighting. On the lower side there is a fixed input of 1 unit weighting, and three variable inputs $Q_1$, $Q_2$ and $Q_3$ each of 1 unit weighting. Considering a fixed input of reinjected bias current on the upper side as a threshold input of positive weighting and a fixed input of reinjected bias current on the lower side therefore constituting a threshold input of negative weighting the net threshold input weighting is $1\frac{1}{2}$ units $-$ 1 unit $=\frac{1}{2}$ unit. Considering a variable logic input of reinjected bias current on the lower side as having a positive weighting and one on the upper side as having a negative weighting it is seen that the first logic gate has logic inputs $Q_1$, $Q_2$, $Q_3$ each having a positive weighting of 1 unit and a further input from the output of the second logic gate and having a weighting of −2 units.

The bistable of the second logic gate is of identical configuration to that present in the first logic gate and therefore corresponding parts are indicated by the same numerals but with a prime suffix. On the upper side there is a fixed input five-layer injector of which the third layer is the p-type region 73 and provides a fixed threshold input of reinjected bias current to the p-type base zone 53' having a positive weighting of $2\frac{1}{2}$ units. On the lower side there is a fixed input five-layer injector of which the third layer is the p-type region 74 and provides a fixed threshold input of reinjected bias current to the p-type base zone 54' having a negative weighting of 1 unit. Thus the net threshold weighting is $1\frac{1}{2}$ units.

At the lower side of the second logic gate there are three five-layer variable input injector structures having p-type regions 75, 76 and 77 as the third layers. The p-type regions 75, 76 and 77 are contacted respectively by the tracks connected to the inputs $Q_1$, $Q_2$ and $Q_3$. The lengths of the regions 75 to 77 facing the region 54' are such that the positive weighting of each input is 1 unit.

The circuit shown in FIG. 11 further comprises conductive connection tracks 81 and 82 to the p-type primary injector regions 51 and 52 respectively via openings in the surface insulating layer and a conductive track 83 which forms connections with the n-type epitaxial layer via the n+-surface region via openings in the surface insulating layer.

It will be apparent that due to the provision of logic gates based on bistables the lay-out of the circuit is relatively simple and the pattern of conductive tracks on the surface is not complex. It is estimated that when forming such a full adder circuit using the form of threshold I²L in accordance with the invention the area saving compared with forming such a circuit in NAND logic I²L is approximately 29%. Furthermore the lay-out of a conventional I²L full adder involves the use of greater lengths of conductor tracks and the number of regions contacted is 41 compared with 24 when using the form of threshold I²L as in FIG. 11.

Referring now to FIG. 12 there is shown the logic truth table of a complex function having four variables A, B, C and D. This function is represented as $F = AC\overline{D} + A\overline{B}C + \overline{A}BD + BCD$. The function can be decomposed into three variable switching functions so that $$F = AF_1(BCD) + \overline{A}F_2(BCD)$$

where $F_1 = \overline{CD} + \overline{BC} + BCD$ and $F_2 = BD + BCD = BD$.

FIG. 13 shows the final logic block diagram of one particular solution of the problem including three gates. The three threshold gates have weightings of $1\frac{1}{2}$, $-\frac{1}{2}$ units. The first gate has inputs D, C, B with weightings of 1, 2 and 1 units respectively. The second gate has an input from the output of the first gate with a weighting of −3 units, inputs D, C, B each with a weighting of 1 unit and an input $\overline{A}$ with a weighting of −2 units. The third gate from which the output F is derived has an input from the complement output of the second gate with a weighting of −3 units, inputs D and B each with a weighting of 1 unit and an input $\overline{A}$ with a weighting of 1 unit.

Figure 14:
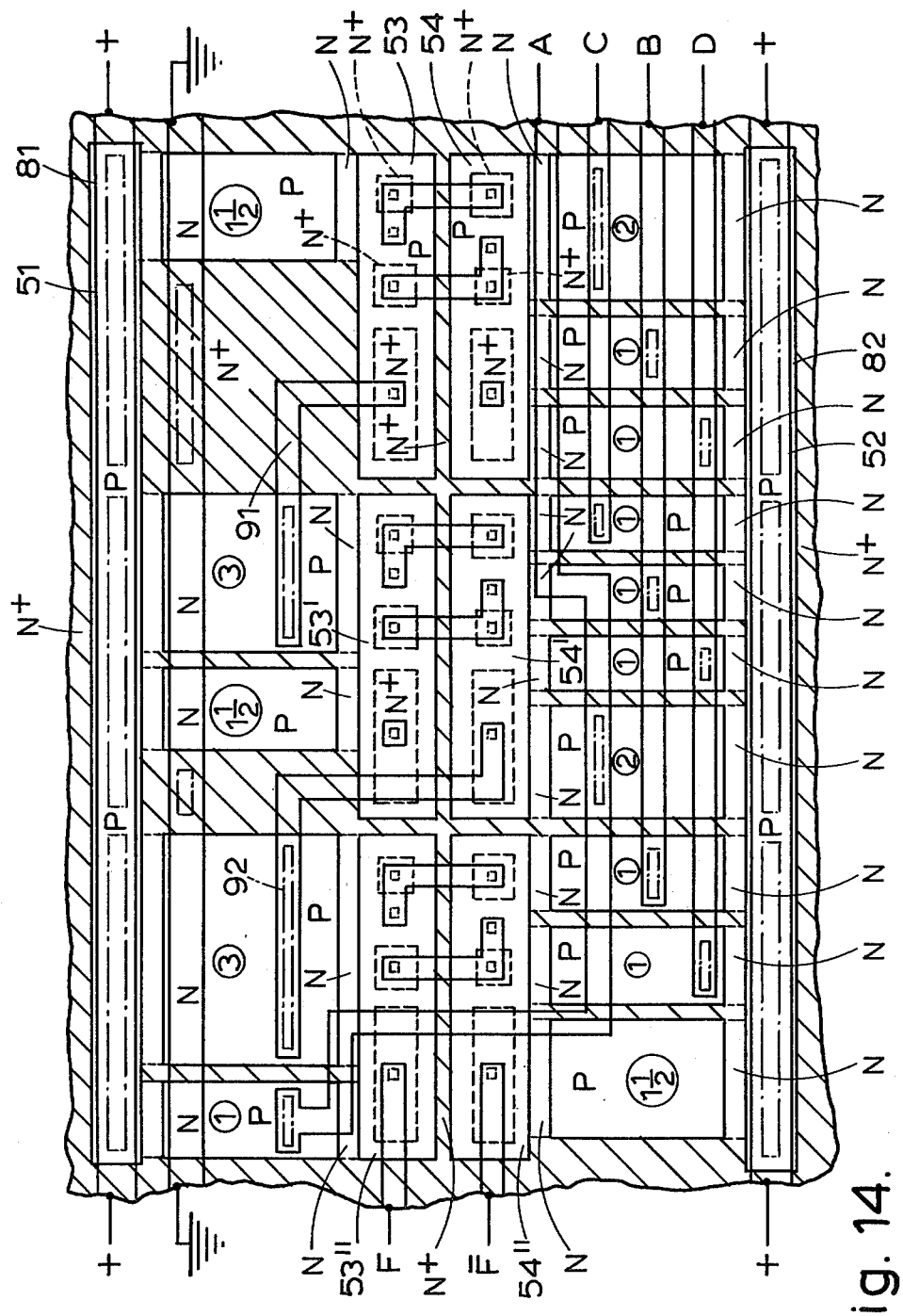
FIG. 14 is a plan view of the semiconductor body of an I$^2$L circuit in accordance with the invention in which the logic function as represented in FIGS. 12 and 13 is present.

FIG. 14 shows the implementation of the logic block diagram of FIG. 13 in an integrated circuit in accordance with the invention. The semiconductor body and the various regions for the bistables are similar to those shown in the embodiment of FIG. 11. For the sake of simplicity corresponding regions and layers are indicated by the same reference numerals. The main difference lies in the fact that there are three logic gates, the third of which has the reference numerals indicated with a double prime suffix and the relative proportioning of the p-type region third layers of the current injector structures are differently determined. In order to simplify the description these p-type regions are not individually referenced but the relative weighting provided in their respective logic gates is indicated in a circle and present on the region.

Thus using the notation that fixed threshold inputs when at the upper sides of the bistables have a positive weighting and when at the lower sides have a negative weighting together with the notation that variable logic inputs when at the lower sides of the bistables have a positive weighting and when at the upper sides have a negative weighting the following applies. In the first logic gate which is on the right hand side of the Figure and has bistable transistors with base zones 53 and 54 there is a fixed threshold input having a positive weighting of $1\frac{1}{2}$ units and variable logic inputs C, B and D, having positive weightings of 2, 1 and 1 units respectively. Also there is an output 91 connection to the third layer of an injector associated with the second logic gate.

In the second logic gate which is in the center of the Figure and has bistable transistors with base zones 53' and 54' there is a fixed threshold input having a positive weighting of $1\frac{1}{2}$ units, a variable logic input having a negative weighting of 3 units and derived from the output of the first logic gate, and variable logic inputs A, B, D and C having positive weighting of 2 units, 1 unit, 1 unit and 1 unit respectively. This does not correspond identically with the logic block diagram of FIG. 10 which in the second logic gate includes a negative threshold weighting of $\frac{1}{2}$ unit and the complement of A, namely $\overline{A}$, with a weighting of −2 units. In this part of the circuit the complement $\overline{A}$ with a weighting of −2 units is realised by using A with a weighting of +2 units and by adding 2 to the threshold weighting of the gate, namely by making the threshold weighting $-\frac{1}{2} + 2 = +1\frac{1}{2}$.

In the third logic gate which is on the left hand side of the Figure and has bistable transistors with base zones 53" and 54" there is a fixed threshold input having a negative weighting of $1\frac{1}{2}$ units, variable logic inputs B and D each having a positive weighting of 1 unit, a variable logic input A having a negative weighting of 1 unit, and a variable logic input taken from the complement output of the second logic gate and having a negative weighting of 3 units. This again does not correspond identically with the logic block diagram of FIG. 10 which in the third logic gate includes a negative threshold weighting of $\frac{1}{2}$ unit and the complement of $A_1$, namely $\overline{A}_1$, with a weighting of 1 unit. In this part of the circuit the complement $\overline{A}$ with a weighting of 1 unit is realised by using A with a weighting of −1 unit and by subtracting 1 from the threshold weighting of the gate, namely by making the threshold $-\frac{1}{2} - 1 = -1\frac{1}{2}$ units.

A further modification will now be described with reference to FIG. 15 which shows part of a logic gate, including the cross coupled transistors of the bistable formed as in the preceding embodiments as inverse vertical n-p-n transistors. The emitter zones of the transistors of the bistable are formed by a common n-type epitaxial layer in which the base zone formed by p-type regions 101 and 102 are provided. The output collector zones of said transistors are formed by n+-regions 103 and 104, one transistor having further collector zones 105 and 106 of which the collector zone 106 is internally connected to the base zone, and the other transistor having further collector zones 107 and 108 of which the collector zone 108 is internally connected to the base zone.

On the input side of the transistor having the base zone 101 there are three five-layer current injector structures. A p-type region 111 constitutes a primary injector of a hole current which is received by three separate p-type regions 112, 113 and 114 forming third layers of the current injector structures. The regions 112, 113 and 114 can supply reinjected bias currents to the p-type base zone 101 and the ratio of the lengths of their edges facing the zone 101 is 1:1:2 and this corresponds to the ratio of the reinjected bias currents supplied.

In the p-type region 112 there is an n+-region 115 forming the collector of an inverse vertical n-p-n transistor of which the base zone is formed by the p-type region 112 and the emitter zone by the n-type epitaxial layer. Similarly in the p-type region 113 there is an n+-region 116 forming the collector of an inverse vertical n-p-n transistor of which the base zone is formed by the p-type region 113 and the emitter zone by the n-type epitaxial layer. A conductive track 117 on the surface insulating layer interconnects the collector zones 115 and 116 and also forms a connection with the p-type zone 114. Conductive tracks 118 and 119 respectively ohmically connected to the p-type zones 112 and 113 form connections to logic inputs from other gates and these inputs are represented by the letters A and B.

In this manner by providing vertical n-p-n transistor collector zones in the third layers of some of the current injectors a logic gate is formed in which the facility of so-called interacting inhibition is provided whereby one variable input signal may block one or more input signals associated with one or more other variable inputs to the bistable.

In the present example at the input side of the transistor of the bistable having the base zone 101 there is incorporated a gate that performs the two variable exclusive OR functions, namely $\overline{F}=A\overline{B}+\overline{A}B$ and its complement $F=AB+\overline{AB}$. Input $\overline{AB}$ is obtained internally via the coupling of the collector zones 115 and 116 of the additional vertical n-p-n transistors to the region 114. Due to the particular dimensions of the p-type regions 112, 113 and 114, then if $A=0$ and $B=0$, then $\overline{AB}=1$ and two units of reinjected bias current reach the p-type base zone 101 from the p-type region 114 and none from the p-type regions 112 and 113 because the primary bias current received by these regions is diverted via the tracks 118 and 119.

When $A=1$, $B=0$, $\overline{AB}=0$ and only one unit of reinjected bias current reaches the p-type base 101, this being from the p-type region 112, and none from the p-type regions 113 and 114 as the primary bias currents received by these regions are diverted respectively via the track 119 and to ground via the collector 116 it being noted that the bias current supplied to region 114 is diverted initially via the collector 116. Similarly if $A=0$, $B=1$, $\overline{AB}=0$ and only one unit of reinjected bias current reaches the base zone 101, this being from the p-type region 113.

When $A=B=1$, $\overline{AB}=0$ and two units of reinjected bias current reach the base zone 101, these being from the p-type regions 112 and 113, none being received from the p-type zone 114 because the additional vertical n-p-n transistors having their collector zone in the p-type regions 112 and 113 are conductive and together sink the primary bias current received by the region 114.

On the right hand side of the bistable there is a single fixed input of reinjected bias current to the base zone 102. This is provided by a five-layer injector structure of which the first layer is formed by a p-type region 121 and the third layer by a p-type region 122. The width of the p-type region 122 is the same as that of the p-type regions 112 to 114 and it is separated from the first and fifth layers of the injector, namely the regions 121 and 102 by distances corresponding to the separation of the third layers of the injectors from the first and fifth layers on the other side of the bistable. The length of the zone 122 facing the zone 102 is such as to provide a reinjected bias current of 1½ units. Thus the gate has a positive threshold weighting of 1½ units, externally generated logic inputs A, B each of 1 unit positive weighting, and an internally generated logic input $\overline{A}\ \overline{B}$ of two units positive weighting.

It will be noted that in the p-type zone 114 there are provided two further N+-regions 124, 125, these being of the same doping as the n+-collector zones 115 and 116. The zones 124, 125 serve to balance the injector currents in the various p-type regions 112, 113, 114. Similarly an extra n+-zone 126 is formed in the p-type zone 122 but of twice the width (in direction transverse to current flow) that of the collector zones 115 and 116.

Figure 15:
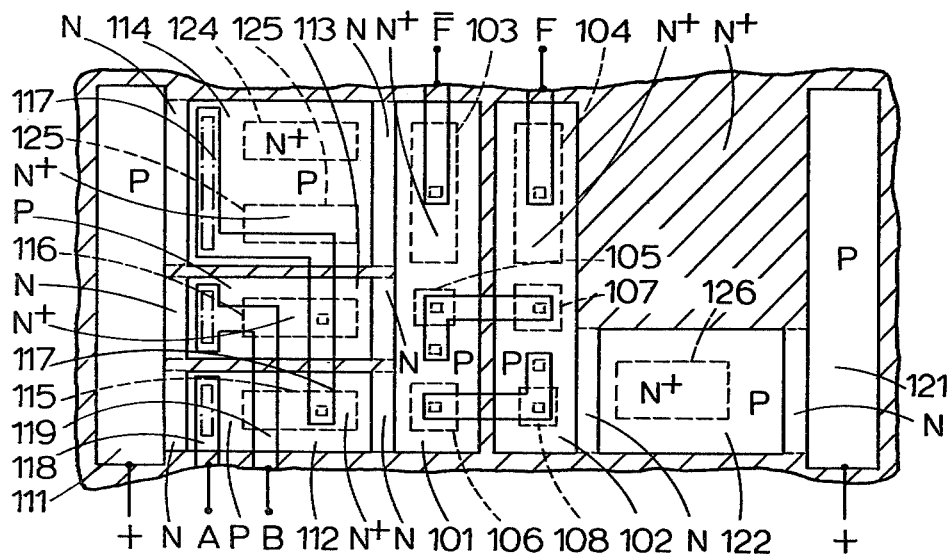
FIG. 15 is a plan view of the semiconductor body of a threshold gate I$^2$L circuit in accordance with the invention and in which the described principle of so-called interactive inhibition is employed in the logic inputs.
Figure 16:
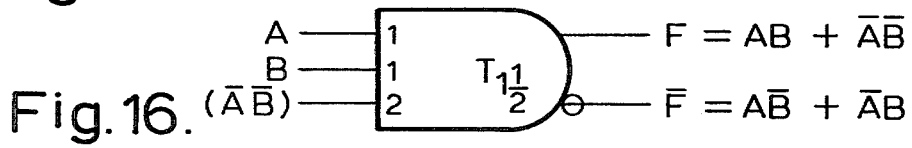
FIG. 16 is a block diagram form of the threshold logic gate implemented in the circuit shown in FIG. 15.

FIG. 16 shows in block form a symbolic representation of the gate shown in FIG. 15. The brackets around $\overline{A}\ \overline{B}$ indicate an internally generated input.

Figure 17:
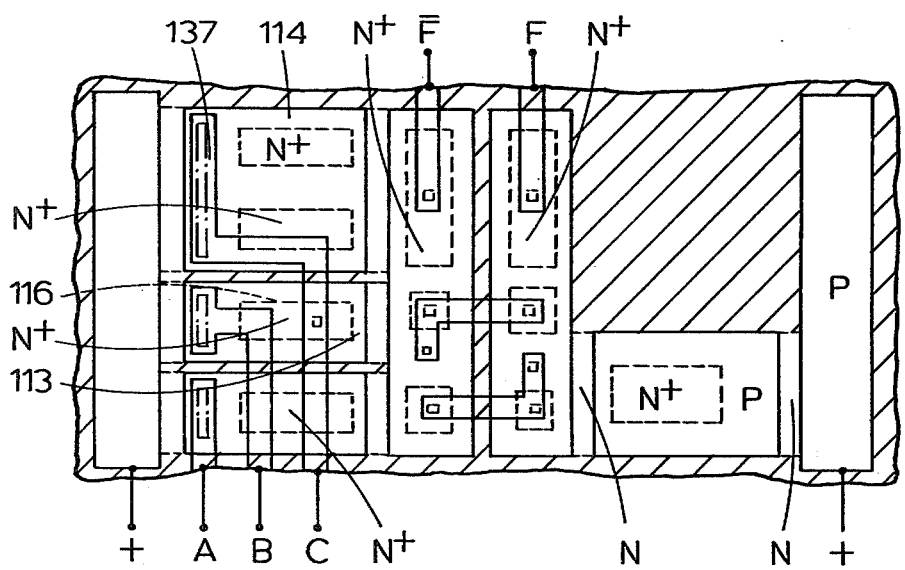
FIG. 17 is a plan view of the semiconductor body of another threshold gate I$^2$L circuit in accordance with the invention and also employing said interactive inhibition.
Figure 18:
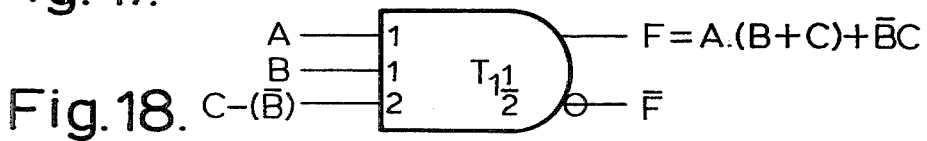
FIG. 18 is a block diagram form of the threshold logic gate implemented in the circuit shown in FIG. 16.

FIG. 17 shows a further modification based on the circuit shown in FIG. 15 but where the interactive inhibition connection is more complex in so far as both internally generated inputs and externally supplied inputs are supplied to the third layer of a current injector structure. The semiconductor regions in this circuit are identical to those present in FIG. 16. The difference resides only in the interconnection pattern in one of the conductive tracks, namely the track 137 is connected to the p-type region 114 as in FIG. 15, to the n+-collector zone 116 as in FIG. 15 but not to the zone 115 which is left floating, said track being connected to a logic input C. In this manner, to the p-type island 114 the input C is externally supplied and also $\overline{B}$ is generated internally and connected to the C input, that is B must be OFF for the double weighted injector comprising the p-type island 114 to react to the C input. Thus the function $F=A\cdot(B+C)+\overline{B}C$ is generated and FIG. 18 is a block diagram representing the gate, the notation $\overline{B}$ in brackets indicating the internal generation of this variable.

It will be appreciated that many modifications are possible within the scope of this invention. In practice the particular weightings, that is those of the logic inputs and/or those of the fixed input(s) may not necessarily all be fixed multiples of a single unit or multiples plus one-half a unit, it being possible to make variations as may be necessary to compensate for various effects in the circuit giving rise to non-uniformity, for example in current gain or current distribution. Also some of the circuits described may be made more compact. The circuit of FIGS. 13 and 14 may be alternatively provided with only two threshold gates by using D·B as one variable and A·C as the other variable, or if interactive inhibition is employed only one threshold gate need be employed using the same input variables. It is of course possible to dispense with the uniformity between the five-layer injector structures on the two opposite sides of the bistable, for example the primary bias current levels on the opposite sides need not be the same provided some further copensation is made in the respective injector structures.

What we claim is:

1. An integrated injection logic circuit comprising at least one threshold logic gate having a plurality of weighted logic inputs and a weighted fixed input determining the threshold, said gate comprising first and second transistors connected as a bistable with the collector zone of the first transistor connected to the base zone of the second transistor and the collector zone of the second transistor connected to the base zone of the first transistor, at least one of said first and second transistors having a further collector zone provided with a conductive, output connection, a plurality of current injector structures being present for determining the bias currents supplied to the first and second transistors, the state of said bistable being determined in accordance with the difference in magnitude of total bias current supplied to the first transistor and total bias current supplied to the second transistor, said plurality of current injector structures comprising injector structures associated with the logic inputs and at least one injector structure associated with a fixed input.

2. An integrated injection logic circuit as claimed in claim 1, wherein in each of the first and second transistors there is an additional collector zone which is internally connected to the base zone for producing a normalized collector current in each of the collectors of the transistor.

3. An integrated injection logic circuit as claimed in claim 2, wherein said first and second transistors are provided in a semiconductor layer of a first conductivity type which constitutes the emitter zones, the base zones being formed by surface regions of the opposite conductivity type situated within the layer of the first conductivity type, the collector zones being formed in the respective regions of the opposite conductivity type by surface regions of the first conductivity type, and in each of first and second transistors the surface area of the additional collector zone which is connected to the base zone being less than the surface area of the or each remaining collector zone.

4. An integrated injection logic circuit as claimed in claim 3, wherein in one or both of said first and second transistors a collector zone having an output conductive connection is of greater surface area than that collector zone in the same transistor which is connected to the base zone of the other transistor.

5. An integrated injection logic circuit as claimed in claims 1 or 2, wherein the logic inputs each have a positive weighting and the fixed input has a positive weighting, the current injector structures associated with the logic inputs being arranged for supplying bias current to the second transistor of the bistable and each current injector structure associated with the fixed input being arranged to provide the supply of a net fixed bias current to the first transistor of the bistable.

6. An integrated injection logic circuit as claimed in claim 1 or 2, wherein the logic inputs comprise at least one input having a positive weighting and at least one input having a negative weighting, each current injector structure associated with a positive weighted logic input being arranged for supplying bias current to the first transistor of the bistable and each current injector structure associated with a negative weighted logic input being arranged for supplying bias current to the second transistor of the bistable.

7. An integrated injection logic circuit as claimed in claim 6, wherein according as the fixed input is of positive or negative weighting, each current injector structure associated with the fixed input is arranged to provide the supply of a net fixed bias current to the first transistor or to the second transistor respectively.

8. An integrated injection logic circuit as claimed in claim 1 or 2, wherein the complement of a required logic input with a weighting of a certain sign is used by the provision of a current injector arranged to provide a weighted bias current of the appropriate magnitude but of the opposite sign and each current injector structure associated with the fixed input is arranged to provide the supply of net fixed bias current which is an amount corresponding to the required threshold fixed bias current of the gate less an amount equal to the weighting of the bias current corresponding to said logic input.

9. An integrated injection logic circuit as claimed in claim 1 or 2, wherein the transistor base zones to be biased and the current injector structures are arranged such that the base zone characteristic of one conductivity type of a transistor in the bistable receives bias current of carriers characteristic of said one conductivity type which are injected from a semiconductor zone of the one conductivity type of the current injector into a zone of the opposite conductivity type separating said base zone from said current injector zone of the one conductivity type, the weighting of an input being determined by the length of the current injector zone of said one conductivity type over which said injection of carriers occurs.

10. An integrated injection logic circuit as claimed in claim 9, wherein the current injector structures are each formed of three succeeding semiconductor regions of alternating conductivity type, of which the third regions correspond to the base zones of the first and second transistors of the bistable.

11. An integrated injection logic circuit as claimed in claim 9, wherein the current injector structures are each formed of five succeeding semiconductor regions of alternating conductivity type, of which the fifth regions correspond to the base zones of the first and second transistors of the bistable.

12. An integrated injection logic circuit as claimed in claim 11, wherein in each of the current injector structures associated with the logic inputs there is a conductive input connection to the third region and in the or each current injector structure associated with the fixed input there is no conductive connection to the third region, means being present for connecting the first regions of all the current injector structures in common and for connecting all the second regions of the current injector structures in common.

13. An integrated injection logic circuit as claimed in claim 12, wherein in a third region of at least one of the current injector structures associated with the logic inputs there is provided the collector zone of a vertical transistor structure of which the emitter zone is formed by the region which constitutes the second layer of the current injector, a connection being present between said collector zone and the third region of another current injector structure associated with a logic input.

* * * * *

UNITED STATES PATENT OFFICE
CERTIFICATE OF CORRECTION

Patent No. 4,242,596   Dated December 30, 1980

Inventor(s)   Kenneth R. Whight

It is certified that error appears in the above-identified patent and that said Letters Patent are hereby corrected as shown below:

Col. 17, line 26,   After "conductive" delete ","

Col. 17, line 50,   Before "each" delete "the or"

Col. 17, line 67,   Change "claim" to read --claims--

Col. 18, line 15,   Change "claim" to read --claims--

Col. 18, line 27,   Change "claim" to read --claims--

Col. 18, line 55,   After "and in" delete "the or"

Signed and Sealed this

Thirtieth Day of June 1981

[SEAL]

Attest:

RENE D. TEGTMEYER

Attesting Officer    Acting Commissioner of Patents and Trademarks